United States Patent
Kodama et al.

(10) Patent No.: US 7,696,071 B2
(45) Date of Patent: Apr. 13, 2010

(54) GROUP III NITRIDE BASED SEMICONDUCTOR AND PRODUCTION METHOD THEREFOR

(75) Inventors: Masahito Kodama, Aichi-ken (JP); Eiko Hayashi, Aichi-ken (JP); Masahiro Sugimoto, Aichi-ken (JP)

(73) Assignees: Kabushiki Kaisha Toyota Chuo Kenkyusho, Aichi-gun, Aichi-ken (JP); Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 161 days.

(21) Appl. No.: 11/976,450

(22) Filed: Oct. 24, 2007

(65) Prior Publication Data

US 2008/0105903 A1    May 8, 2008

(30) Foreign Application Priority Data

Oct. 24, 2006  (JP)  ............... 2006-289055

(51) Int. Cl.
  *H01L 21/20*  (2006.01)
  *H01L 21/36*  (2006.01)
(52) U.S. Cl. ............... 438/504; 438/481; 257/E21.123; 257/E21.125
(58) Field of Classification Search ............... 438/481, 438/504, 341; 257/E21.125, E21.126
See application file for complete search history.

(56) References Cited

U.S. PATENT DOCUMENTS 6,294,475 B1 *  9/2001  Schubert et al. ............. 438/712
2004/0264533 A1 * 12/2004  Matsumura et al. .......... 372/45
2005/0092234 A1 *  5/2005  Motoki et al. ................. 117/91
2007/0259464 A1 * 11/2007  Bour et al. ..................... 438/22
2008/0105954 A1   5/2008  Kodama et al.

FOREIGN PATENT DOCUMENTS

| JP | 10-256661 | 9/1998 |
| JP | 2002-261027 | 9/2002 |
| JP | 2002-367909 | 12/2002 |
| JP | 2003-517725 | 5/2003 |
| JP | 2004-260140 | 9/2004 |
| JP | 2005-33099 | 2/2005 |
| WO | WO 01/11690 A1 | 2/2001 |

OTHER PUBLICATIONS

Translation of JP2002-261027, translated Nov. 30, 2009, 15 pages.*
S. K. Hong, et al., "Original of hexagonal-shaped etch pits formed in (0001) GaN films", Applied Physics Letters, Jul. 3, 2000, vol. 77, No. 1, p. 82-84.
Japanese Office Action dated Jul. 28, 2009, with partial English translation.

* cited by examiner

*Primary Examiner*—Caridad M Everhart
(74) *Attorney, Agent, or Firm*—McGinn IP Law Group, PLLC

(57) ABSTRACT

The invention provides a method for producing a group III nitride based semiconductor having a reduced number of crystal defects.

A GaN layer 2 is epitaxially grown on a sapphire substrate 1 having C-plane as a main plane (FIG. 1A). Then, the layer is wet-etched by use of a 25% aqueous TMAH solution at 85° C. for one hour, to thereby form an etch pit 4 (FIG. 1B). Then, a GaN layer 5 is grown on the GaN layer 2 through the ELO method (FIG. 1C). The thus-formed GaN layer 5 has a screw dislocation density lower than that of the GaN layer 2.

13 Claims, 3 Drawing Sheets

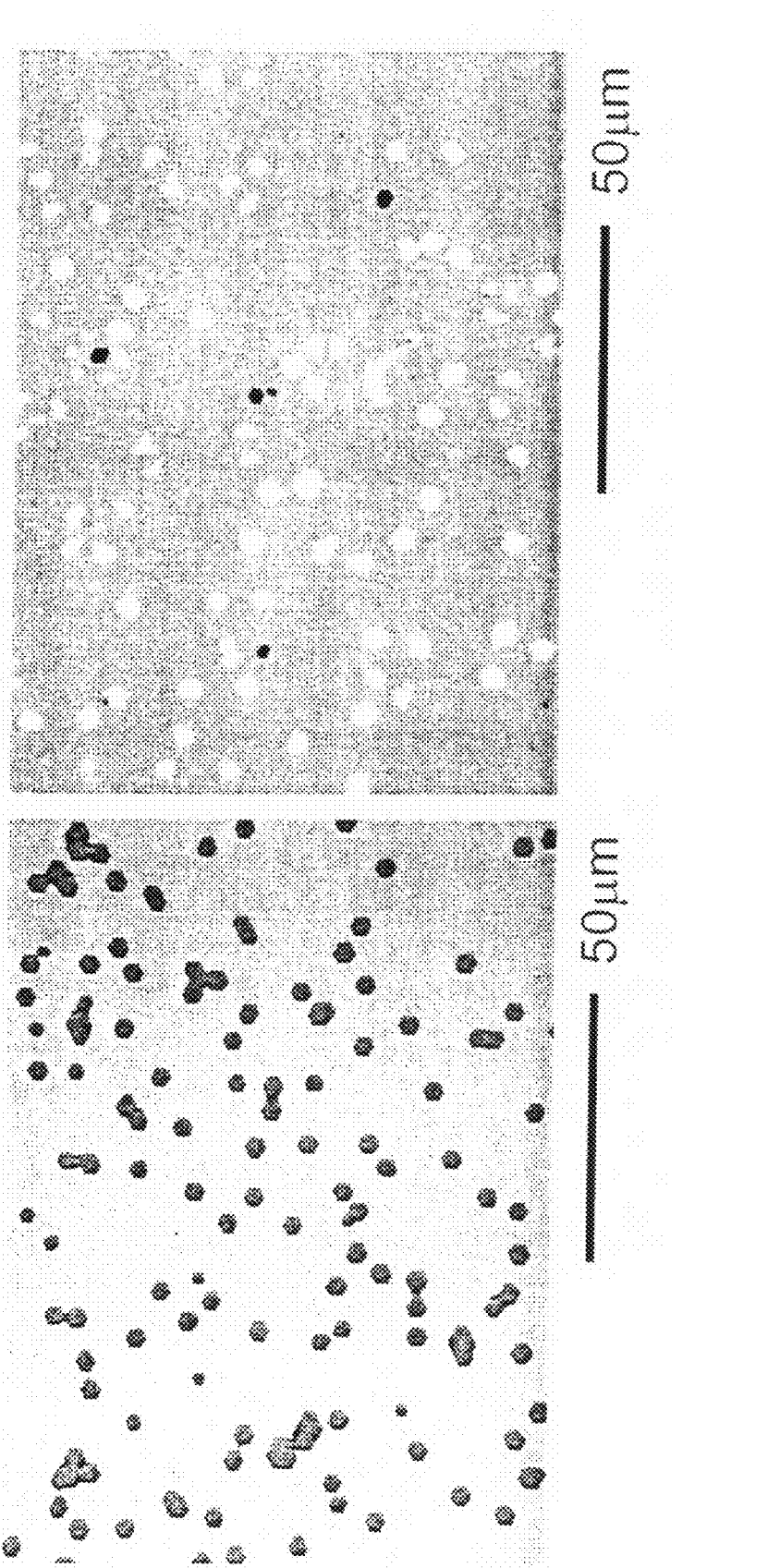

GROUP III NITRIDE BASED SEMICONDUCTOR AND PRODUCTION METHOD THEREFOR

TECHNICAL FIELD

The present invention relates to a group III nitride based semiconductor having a reduced number of crystal defects and to a method for producing the semiconductor.

BACKGROUND ART

Generally, in production of group III nitride based semiconductor crystal substrates, a group III nitride based semiconductor layer is formed on a sapphire substrate. However, due to difference in lattice constant between a group III nitride based semiconductor and sapphire, a large number of dislocations are unavoidably generated in the produced group III nitride based semiconductor crystal substrates. Among such dislocations, screw dislocations result in generation of vacancies having a diameter of a few to several nanometers, which are called micropipes and which penetrate through the layer in the thickness direction. If such a group III nitride based semiconductor is used to produce a semiconductor device, micropipes may cause current leakage, to thereby deteriorate performance of the semiconductor device. Therefore, reduction of dislocation density is preferred.

Possible approaches for reducing dislocation density are known as methods for producing group III nitride based semiconductors disclosed in Patent Documents 1 and 2. In these methods, a group III nitride based semiconductor layer is etched to form etch pits, and another group III nitride based semiconductor layer is epitaxially grown on the etched group III nitride based semiconductor layer so that the etch pits are filled with the epitaxial layer. According to these methods, dislocation density of the upper group III nitride based semiconductor layer can be lowered as compared with that of the lower group III nitride based semiconductor layer.

Etching techniques for forming etch pits employed in the production methods are also disclosed. Patent Document 1 discloses an etching process employing ammonia or hydrogen gas, whereas Patent Document 2 discloses a wet etching process employing phosphoric acid, sulfuric acid, or KOH, and an etching process employing HCl gas, $Cl_2$ gas, or $BCl_3$ gas.

Patent Document 1 does not disclose the shape of etch pits. Patent Document 2 discloses that the shape of the formed etch pits is conical, hexagonal pyramid, bowl-like, partial-spherical, or a complex shape thereof.

Patent Document 1: Japanese Patent Application Laid-Open (kokai) No. 2002-367909

Patent Document 2: Japanese Patent Application Laid-Open (kokai) No. 2002-261027

DISCLOSURE OF THE INVENTION

Problems to be Solved by the Invention

However, when the aforementioned wet etching is employed, the aforementioned etchants are used at high temperature, which may be unsafe. KOH solution, which readily adheres on group III nitride based semiconductor, is difficult to wash out. Since gas etching is performed at high temperature, a material of a mask employed in the gas etching is reacted with the group III nitride based semiconductor, leading to variation in composition of the semiconductor surface.

In addition, since the mask itself is also etched, etch pits having sufficient dimensions are difficult to form. Note that Patent Documents 1 and 2 do not describe etch pits of a hexagonal prism.

Thus, an object of the present invention is to produce a group III nitride based semiconductor having lower dislocation density through employment of an etching technique which is highly safe, which can be performed in a simple manner, and which can provide etch pits of sufficient dimensions. Another object of the present invention is to provide a group III nitride based semiconductor of a novel structure having low dislocation density.

Means for Solving the Problems

In a first aspect of the invention, there is provided a method for producing a group III nitride based semiconductor, characterized in that the method comprises a step of wet-etching an upper surface of a first layer comprising a first group III nitride based semiconductor with an aqueous TMAH solution, to thereby form an etch pit, and a step of forming, on the upper surface of the first layer, a second layer comprising a second group III nitride based semiconductor so that an upper portion of the etch pit is filled with the second layer.

As used herein, the term "group III nitride based semiconductor" refers to a compound semiconductor represented by the formula: $Al_xGa_yIn_zN$ (x+y+z=1, $0 \leq x, y, z \leq 1$), such as GaN, AlGaN, InGaN, or AlGaInN. The group III nitride based semiconductor may be doped with an impurity for controlling the conduction type to n or p.

The second layer is formed so as to fill etch pits therewith. An etch pit may be entirely or partially filled with the formed second layer. The filling degree may be controlled by selecting conditions under which the second layer is grown. In the case where an etch pit is partially filled with the formed second layer, a portion of the etch pit remains as a vacancy in the first layer.

Aqueous TMAH (tetra methyl ammonium hydroxide: $(CH_3)_4NOH$) solution can etch a crystal plane of a group III nitride based semiconductor other than C-plane, to thereby form etch pits. The aqueous TMAH solution preferably has a concentration of 5 to 50%, and is used at 50 to 100° C., more preferably a concentration of 5 to 25% and at 80° C. to 100° C. In particular, according to a second aspect of the invention, in which the main plane of the first layer is C-plane, the first layer is not etched in the thickness direction. In addition, since side surfaces of micropipes assume an exposed crystal plane other than C-plane of the first layer, etch pits can be formed without decreasing the layer thickness. According to the second aspect, etching of micropipes in the first layer proceeds while M-plane of the micropipes is maintained. Thus, hexagonal-prismatic etch pits each having an M-plane side surface are formed in the first layer.

Through this etching process, portions having mismatch in terms of crystal orientation, which cause micropipes (i.e., screw dislocations), can be removed, whereby a second layer can be grown on the first layer from proper portions of the first layer each having no crystal orientation mismatch as crystal growth nuclei. Therefore, the second layer has a dislocation density lower than that of the first layer.

The group III nitride based semiconductor forming the first layer does not necessarily have the same composition as that of the group III nitride based semiconductor forming the second layer. For example, the first layer may comprise GaN, and the second layer may comprise AlGaN. However, according to a third aspect of the invention, in which the group III nitride based semiconductor forming the first layer has a composition identical to that of the group III nitride based semiconductor forming the second layer, the two layers are matched with each other in terms of lattice constants. Therefore, dislocation density of the second layer can be further reduced.

According to a fourth aspect of the invention, in which the second layer is formed through the ELO method, etch pits in the first layer can be readily filled with the second layer. Thus, the thickness of the second layer can be reduced.

According to a fifth aspect of the invention, the diameter of etch pits is 1 μm or more, which is realized through controlling concentration and temperature of aqueous TMAH solution and etching time. Since aqueous TMAH solution can be used at relatively low temperature and handled in a simple manner, the above control can be readily attained. When the diameter is regulated to 1 μm or more, portions having crystal orientation mismatch can be substantially removed.

In the case where the first layer is formed on a substrate (e.g., sapphire substrate), a buffer layer for relaxing mismatch in lattice constants is preferably provided between the first layer and the substrate (e.g., sapphire substrate). By virtue of such a buffer layer, dislocation density of the first layer decreases, whereby dislocation density of the second layer can be further decreased.

The production method of the present invention may be carried out repeatedly. For example, the second layer is further etched with aqueous TMAH solution, to thereby form etch pits, and another group III nitride based semiconductor layer is formed on the second layer. Through such repetition, a group III nitride based semiconductor layer having further reduced dislocation density can be formed.

A sixth aspect of the invention is drawn to a specific embodiment of the production method according to any of the first to fifth aspects, wherein the second layer is formed so that the etch pit is entirely or partially filled with the second layer, and the method further includes, after the step of forming the second layer, a step of removing a portion of the second layer which is present above the first layer.

In a portion of the second layer corresponding to a filled etch pit, new screw dislocations are rarely generated, since crystal orientation mismatch between the first and second layers has already been removed through etching. However, new screw dislocations may possibly be generated in another portion of the second layer other than the above portion. Therefore, according to a sixth aspect of the invention, a portion in the second layer other than the portion corresponding to the filled etch pit is removed, to thereby reduce screw dislocation density. For removal of the second layer, one preferably employed method is an etch-back method in which the second layer is removed until the first layer is exposed. On the upper surface of the thus-exposed first layer, a group III nitride based semiconductor layer having a composition identical to or different from that of the first layer may be grown.

A seventh aspect of the invention is drawn to a group III nitride based semiconductor, which has a structure including a first layer comprising a first group III nitride based semiconductor and a second layer comprising a second group III nitride based semiconductor provided on an upper surface of the first layer, characterized in that the first layer has C-plane as a main plane for crystal growth and contains an etch pit of a hexagonal prism shape formed therein, and the second layer is formed so that an upper portion of the etch pit is filled with the second layer.

EFFECTS OF THE INVENTION

According to the first aspect of the invention, a first layer is wet-etched with an aqueous TMAH solution, to thereby form etch pits. Through this etching, etch pits of a large diameter can be readily formed, and portions having crystal orientation mismatch can be satisfactorily removed. A second layer formed on the first layer has a dislocation density lower than that of the first layer. Thus, a high-quality group III nitride based semiconductor can be produced. In addition, an undesired change in surface composition of a group III nitride based semiconductor layer, which occurs during gas etching, can be prevented. Particularly when the first layer has C-plane as a main plane for crystal growth, a roper portion of the first layer is not etched, and the thickness of the first layer is not reduced.

According to the sixth aspect of the invention, a portion of the second layer where a new dislocation is generated with a high possibility is removed, whereby dislocation density is reduced.

According to the seventh aspect of the invention, the group III nitride based semiconductor has a structure including a first layer in which hexagonal prismatic etch pits have been formed, and a second layer formed on the first layer. Thus, a semiconductor substrate in which the second layer has a dislocation density lower than that of the first layer can be provided.

BRIEF DESCRIPTION OF THE DRAWINGS

FIG. 2 is a photograph of etch pits taken under an optical microscope.

FIG. 3 is a photograph of etch pits taken under an optical microscope.

BEST MODES FOR CARRYING OUT THE INVENTION

By reference to the attached drawings, embodiments of the present invention will next be described in detail. However, these embodiments should not be construed as limiting the invention thereto.

Embodiment 1

Figure 1A:
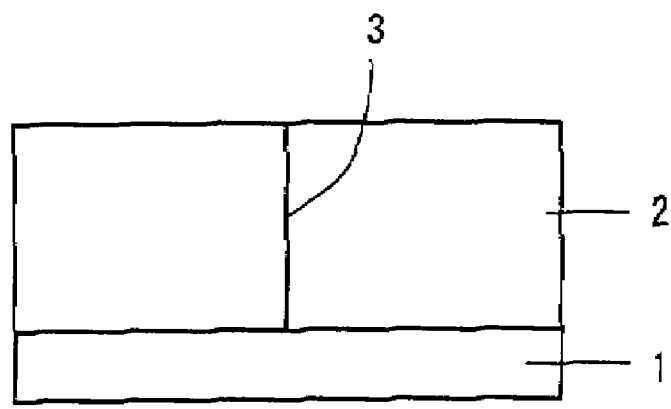
FIGS. 1A to 1C are process diagrams of producing a GaN substrate of Embodiment 1.
Figure 1B:
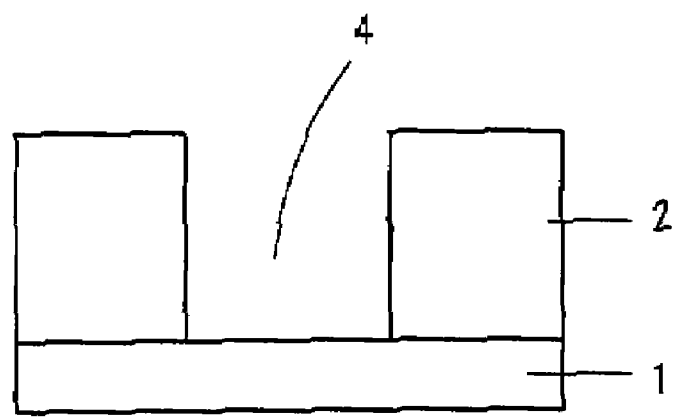

FIGS. 1A to 1B are schematic cross-sections of a GaN substrate of Embodiment 1, showing steps of producing the GaN substrate. Firstly, on a sapphire substrate 1 having C-plane as a main plane for crystal growth, a GaN layer 2 (thickness: 3 μm) (i.e., a first layer in the present invention) was epitaxially grown. Thus, the main plane of the GaN layer 2 is C-plane. During expitaxial growth, micropipes 3 which penetrate through the GaN layer 2 and reach the upper surface of the sapphire substrate 1 are generated (FIG. 1A). The micropipes 3 are micropores having a diameter of a few to several nanometers and are generated by screw dislocations. In other words, the micropipes 3 are generated in a portion of GaN layer 2 where crystal orientation is disarrayed due to the difference in, for example, lattice constant between the sapphire substrate 1 and the GaN layer 2.

Subsequently, wet etching was performed by use of a 25% aqueous TMAH solution at 85° C. for one hour. Aqueous TMAH solution cannot etch C-plane of GaN, but can etch a crystal plane other than C-plane. Since the surface of the GaN layer 2 is C-plane, the side wall of each micropipe 3 is a crystal plane other than C-plane of the GaN layer 2. Therefore, the side wall of each micropipe 3 in the GaN layer 2 is etched by aqueous TMAH solution, to thereby form an etch pit 4 (FIG. 1B). Since the side wall of the etch pit 4 is M-plane of the GaN layer 2, the etch pit 4 assumes the form of a hexagonal prism. FIG. 2 is a photograph, taken under an optical microscope, of a surface of the GaN layer 2 including the thus-formed etch pits. In the photograph, a large number of hexagonal-prismatic etch pits having almost the same size are observed. Some of these etch pits overlap one another, to thereby form a larger etch pit. The etch pits were found to have a mean diameter of about 6 μm and an etch pit density (i.e., screw dislocation density) of $1 \times 10^6$ cm$^{-2}$.

Figure 1C:
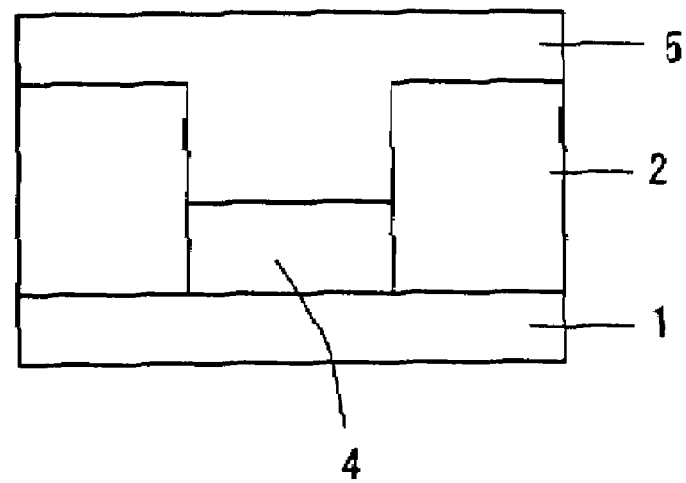

Subsequently, a GaN layer 5 (a second layer in the present invention) was grown on the GaN layer 2 through the ELO method from an unetched portion of the GaN layer 2 serving as a growth nucleus, i.e., seeds, to thereby form a portion (lateral dimension: 5 μm, vertical dimension: 1.25 μm), which filled an upper portion of the etch pit 4 (FIG. 1C). The etch pit 4 is not completely filled with the GaN layer and still has a cavity.

In order to detect screw dislocation density of the GaN layer 5 formed through the above steps, etch pits were formed through wet etching for 30 minutes by use of aqueous TMAH solution. FIG. 3 is a photograph, taken under an optical microscope, of a surface of the GaN layer 5 including the thus-formed etch pits. In the photograph, two types of formed etch pits having different diameters are observed. The larger etch pits having a diameter of 2 to 5 μm were formed, since a plurality of etch pits in the GaN layer 2 were overlapped to form larger etch pits, which were not completely filled with the laterally grown GaN layer 5. The smaller etch pits having a diameter of 1 μm or less originated from micropipes newly formed in the GaN layer 5. These micropipes penetrate through the GaN layer 5 and reach the upper surface of the GaN layer 2, but do not reach the sapphire substrate 1. In FIG. 3, white portions correspond to the cavities, which remain after incomplete filling of the etch pits in the GaN layer 2 with the GaN layer 5. Some small pits are present in the vicinity of the white portions. These small pits are conceivably formed by micropipes in the GaN layer 5, because micropipes are induced by a portion having distortion of crystal orientation which portion has not been removed after etching of the GaN layer 2. The total etch pit density (sum of larger pits and smaller pits) is $8 \times 10^4$ cm$^{-2}$, which is 1/25 the etch pit density of the GaN layer 2.

Thus, the etch pit density of the GaN layer 5 is considerably reduced as compared with that of the GaN layer 2.

Embodiment 2

Figure 4A:
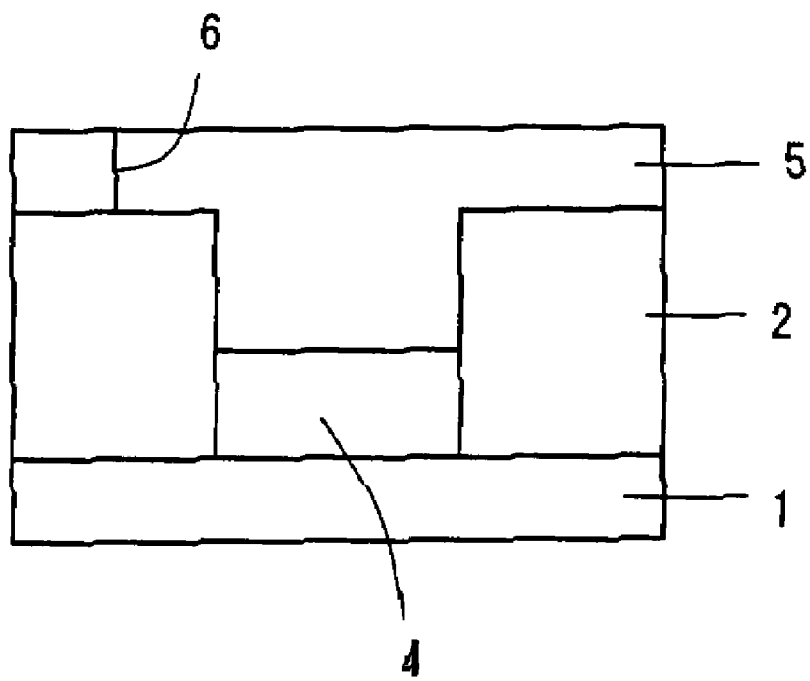
FIGS. 4A to 4B are process diagrams of producing a GaN substrate of Embodiment 2.
Figure 4B:
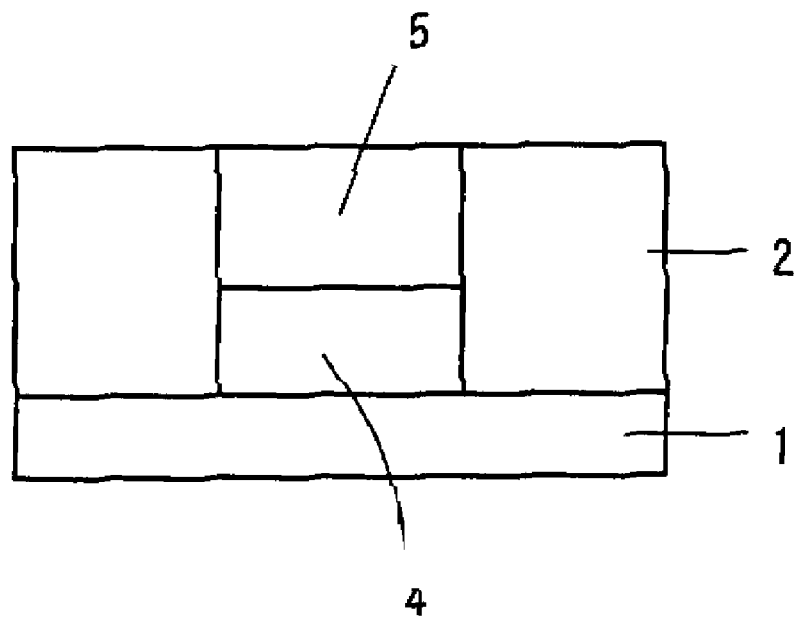

FIGS. 4A and 4B are schematic cross-sections of a GaN substrate of Embodiment 2, showing steps of producing the GaN substrate. The same steps as shown in FIGS. 1A to 1C were employed, and detailed description thereof is omitted. As described above, micropipes are newly generated in the GaN layer 5 formed through the production method of Embodiment 1. The micropipes in the GaN layer 5 are generated newly in a portion of the GaN layer 5 other than the portions above the etch pits. FIG. 4A shows this feature. A micropipe 6 is a typical example of such a micropipe. Thus, in Embodiment 2, the micropipe 6 is removed through etching back the GaN layer 5 until the upper surface of the GaN layer 2 is exposed (FIG. 4B). Generation of new micropipes is prevented to some extent in the portions of the GaN layer 5 remaining at lower side from the upper surface of the GaN layer 2. In addition, since micropipes in the GaN layer 2 have already been removed through formation of etch pits, the number of dislocations in the semiconductor substrate is reduced. Therefore, the GaN substrate produced in Embodiment 2 has a small number of dislocations.

In Embodiments 1 and 2, a buffer layer may be provided between the sapphire substrate 1 and the GaN layer 2. Through provision of the buffer layer, dislocation density of the GaN layer 2 can be reduced, whereby dislocation density of the GaN layer 5 can also be reduced. In Embodiments 1 and 2, the main plane of the GaN layer 2 is C-plane. However, the main plane for crystal growth is not limited to C-plane in the present invention, and a crystal plane such as A-plane or M-plane may also be employed. In a manner similar to those of the Embodiments, etch pits may be formed in these crystal planes. The production method of Embodiment 1 may be performed repeatedly. Specifically, the GaN layer 5 is wet-etched again by use of aqueous TMAH solution, to thereby form etch pits, and a new GaN layer is formed on the GaN layer 5. This procedure is repeatedly performed, to thereby form, on the GaN layer 2, stacked GaN layers each including etch pits. Thus, through repetition of the production method of Embodiment 1, dislocation density can be further reduced.

In Embodiment 2, on the upper surface of the semiconductor substrate shown in FIG. 4B, a group III nitride based semiconductor having a composition identical to or different from GaN may also be grown. Since the group III nitride based semiconductor is grown on the surface having low defect density, a high-quality group III nitride based semiconductor can be produced.

INDUSTRIAL APPLICABILITY

Through employment of the group III nitride based semiconductor of the present invention in the production of semiconductor devices, device characteristics can be improved.

The invention claimed is:

1. A method for producing a group III nitride based semiconductor, the method comprising:
   a wet-etching an upper surface of a first layer comprising a first group III nitride based semiconductor with an aqueous TMAH solution, to thereby form an etch pit, and
   a forming, on the upper surface of the first layer, a second layer comprising a second group III nitride based semiconductor so that an upper portion of the etch pit is filled with the second layer.

2. A method for producing a group III nitride based semiconductor according to claim 1, wherein the second layer is formed through the ELO method.

3. A method for producing a group III nitride based semiconductor according to claim 1, wherein the etch pit has a diameter of 1 μm or more.

4. A method for producing a group III nitride based semiconductor according to claim 1, wherein the second layer is formed so that the etch pit is entirely or partially filled with the second layer, and the method further includes, after the forming the second layer, removing a portion of the second layer which is present above the first layer.

5. A method for producing a group III nitride based semiconductor according to claim 1, wherein a main plane for crystal growth of the first layer is C-plane.

6. A method for producing a group III nitride based semiconductor according to claim 5, wherein the first group III nitride based semiconductor forming the first layer and the second group III nitride based semiconductor forming the second layer have the same composition.

7. A method for producing a group III nitride based semiconductor according to claim 5, wherein the second layer is formed through the ELO method.

8. A method for producing a group III nitride based semiconductor according to claim 5, wherein the etch pit has a diameter of 1 µm or more.

9. A method for producing a group III nitride based semiconductor according to claim 5, wherein the second layer is formed so that the etch pit is entirely or partially filled with the second layer, and the method further includes, after the forming the second layer, removing a portion of the second layer which is present above the first layer.

10. A method for producing a group III nitride based semiconductor according to claim 1, wherein the first group III nitride based semiconductor forming the first layer and the second group III nitride based semiconductor forming the second layer have the same composition.

11. A method for producing a group III nitride based semiconductor according to claim 10, wherein the second layer is formed through the ELO method.

12. A method for producing a group III nitride based semiconductor according to claim 10, wherein the etch pit has a diameter of 1 µm or more.

13. A method for producing a group III nitride based semiconductor according to claim 10, wherein the second layer is formed so that the etch pit is entirely or partially filled with the second layer, and the method further includes, after the forming the second layer, removing a portion of the second layer which is present above the first layer.

\* \* \* \* \*